(12) United States Patent
Kudo et al.

(10) Patent No.: US 11,171,770 B2
(45) Date of Patent: Nov. 9, 2021

(54) DATA TRANSMISSION DEVICE

(71) Applicants: Kabushiki Kaisha Toshiba, Tokyo (JP); Toshiba Electronic Devices & Storage Corporation, Tokyo (JP)

(72) Inventors: Tsukasa Kudo, Kamakura Kanagawa (JP); Michitomo Yamaguchi, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/995,126

(22) Filed: Aug. 17, 2020

(65) Prior Publication Data

US 2021/0297231 A1     Sep. 23, 2021

(30) Foreign Application Priority Data

Mar. 23, 2020  (JP) .............................. JP2020-051502

(51) Int. Cl.
  *H04L 7/00* (2006.01)
  *G11C 19/28* (2006.01)
  *H03K 3/037* (2006.01)

(52) U.S. Cl.
  CPC ............ *H04L 7/0091* (2013.01); *G11C 19/28* (2013.01); *H03K 3/037* (2013.01)

(58) Field of Classification Search
  CPC .......... H04L 7/0091; H04L 7/048; H04L 7/06
  See application file for complete search history.

(56) References Cited

U.S. PATENT DOCUMENTS

| 6,160,847 A * | 12/2000 | Wu .......................... G06T 9/007 348/419.1 |
| 9,594,396 B2 * | 3/2017 | Turner ...................... G06F 1/12 |
| 2005/0193290 A1 * | 9/2005 | Cho .................. G01R 31/31715 714/710 |

FOREIGN PATENT DOCUMENTS

| JP | H06-69913 A | 3/1994 |
| JP | 2001-94612 A | 4/2001 |
| JP | 3316426 B2 | 8/2002 |

* cited by examiner

*Primary Examiner* — Patrick O'Neill

(57) ABSTRACT

A data transmission device of an embodiment includes a buffer, a first determination circuit, a first flip-flop, a second flip-flop, and a second determination circuit. The buffer holds input data of a predetermined bit width. The first determination circuit determines whether or not the input data is held in the buffer. The first flip-flop receives output of the first determination circuit as input and operates at one of a rising edge and a falling edge of a second clock signal which is asynchronous with the first clock signal. The second flip-flop receives output of the first flip-flop as input and operates at another of the rising edge and the falling edge of the second clock signal. The second determination circuit determines an error based on a request signal which is synchronized with the second clock signal and output of the second flip-flop.

8 Claims, 4 Drawing Sheets

DATA TRANSMISSION DEVICE

CROSS-REFERENCE TO RELATED APPLICATION

This application is based upon and claims the benefit of priority from Japanese Patent Application No. 2020-051502, filed Mar. 23, 2020; the entire contents of which are incorporated herein by reference.

FIELD

An embodiment described herein relates generally to a data transmission device.

BACKGROUND

Conventionally, at a serial interface, a slave outputs transmission data to a master by detecting a data transfer request and a clock signal being input from the master to the slave. The clock signal (external clock) input from the master to the slave is asynchronous with a clock signal (internal clock) generated inside the slave, and oscillation stops during a period other than a data transfer period.

At a data transmission device which is the slave, after data of a predetermined bit width is written in a FIFO (First-In First-Out), the data is transferred to a shift register, and the shift register outputs the data one bit at a time. In a case where supply of data to the FIFO is delayed for request of the transmission data from the master, that is, in a case where the data is not held in the FIFO, an underflow error occurs. In a case where an underflow error occurs, because the slave needs to notify the master of occurrence of the underflow error, it is necessary to accurately detect an underflow error.

DETAILED DESCRIPTION

A data transmission device of an embodiment includes a buffer, a first determination circuit, a first flip-flop, a second flip-flop, and a second determination circuit. The buffer is synchronized with a first clock signal, and holds input data of a predetermined bit width. The first determination circuit determines whether or not the input data is held in the buffer. The first flip-flop receives output of the first determination circuit as input, and operates at one of a rising edge and a falling edge of a second clock signal which is asynchronous with the first clock signal. The second flip-flop receives output of the first flip-flop as input, and operates at another of the rising edge and the falling edge of the second clock signal. The second determination circuit determines an error based on a request signal which is synchronized with the second clock signal and output of the second flip-flop.

An embodiment will be described in detail below with reference to the drawings.

Figure 1:
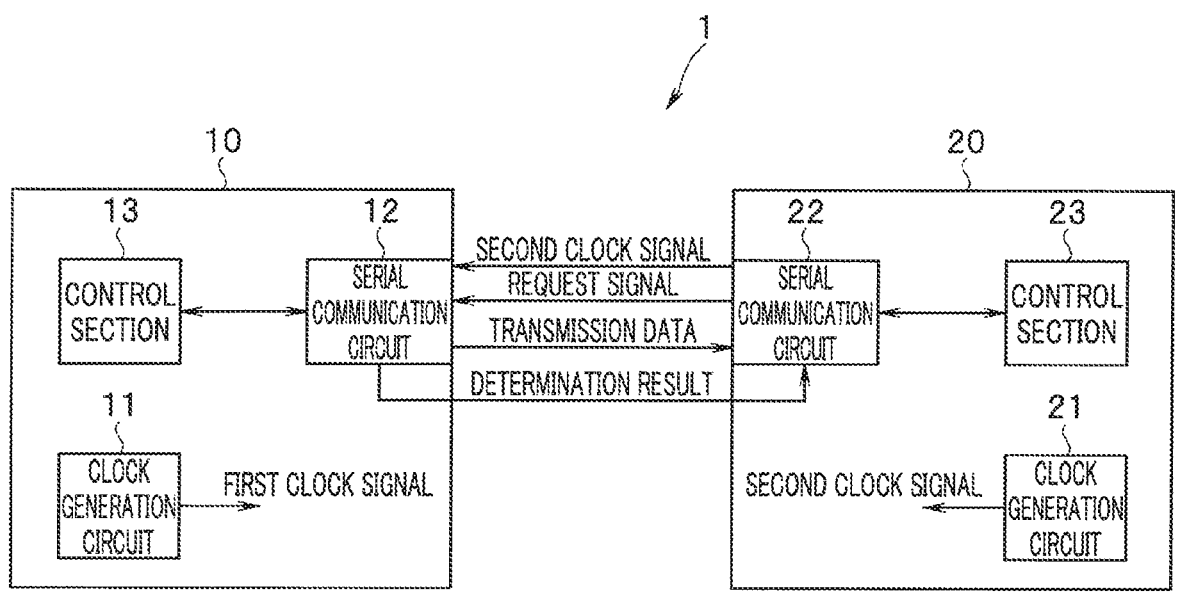
FIG. 1 is a block diagram illustrating a configuration of a communication system including a data transmission device of one embodiment.

FIG. 1 is a block diagram illustrating a configuration of a communication system including a data transmission device of one embodiment.

As illustrated in FIG. 1, a communication system 1 includes a first micro-control unit 10, and a second micro-control unit 20. Note that, in the following description, the first micro-control unit 10 and the second micro-control unit 20 will be respectively referred to as a first MCU 10 and a second MCU 20.

The first MCU 10 includes a clock generation circuit 11, a serial communication circuit 12, and a control section 13. The clock generation circuit 11 generates a first clock signal of a predetermined frequency, and supplies the first clock signal to the serial communication circuit 12, the control section 13, and respective circuit sections within the first MCU 10. The serial communication circuit 12, the control section 13, and the respective circuit sections of the first MCU 10 operate based on the first clock signal generated by the clock generation circuit 11.

Further, the second MCU 20 includes a clock generation circuit 21, a serial communication circuit 22, and a control section 23. The clock generation circuit 21 generates a second clock signal which is asynchronous with the first clock signal, and supplies the second clock signal to the serial communication circuit 22, the control section 23, and respective circuit sections within the second MCU 20. The serial communication circuit 22, the control section 23, and the respective circuit sections of the second MCU 20 operate based on the second clock signal generated by the clock generation circuit 21.

The second MCU 20 which is a mater requests transfer of data to the first MCU 10 which is a slave, and receives transmission data from the first MCU 10. More specifically, the second MCU 20 transmits a request signal for requesting transfer of data and the second clock signal to the first MCU 10. The request signal and the second clock signal are transmitted from the serial communication circuit 22 to the serial communication circuit 12.

When the request signal and the second clock signal are input, the serial communication circuit 12 which constitutes the data transmission device transmits transmission data to the serial communication circuit 22 of the second MCU 20. Further, the serial communication circuit 12 transmits a determination result of an underflow error which will be described later to the serial communication circuit 22 of the second MCU 20 as an interrupt signal.

Figure 2:
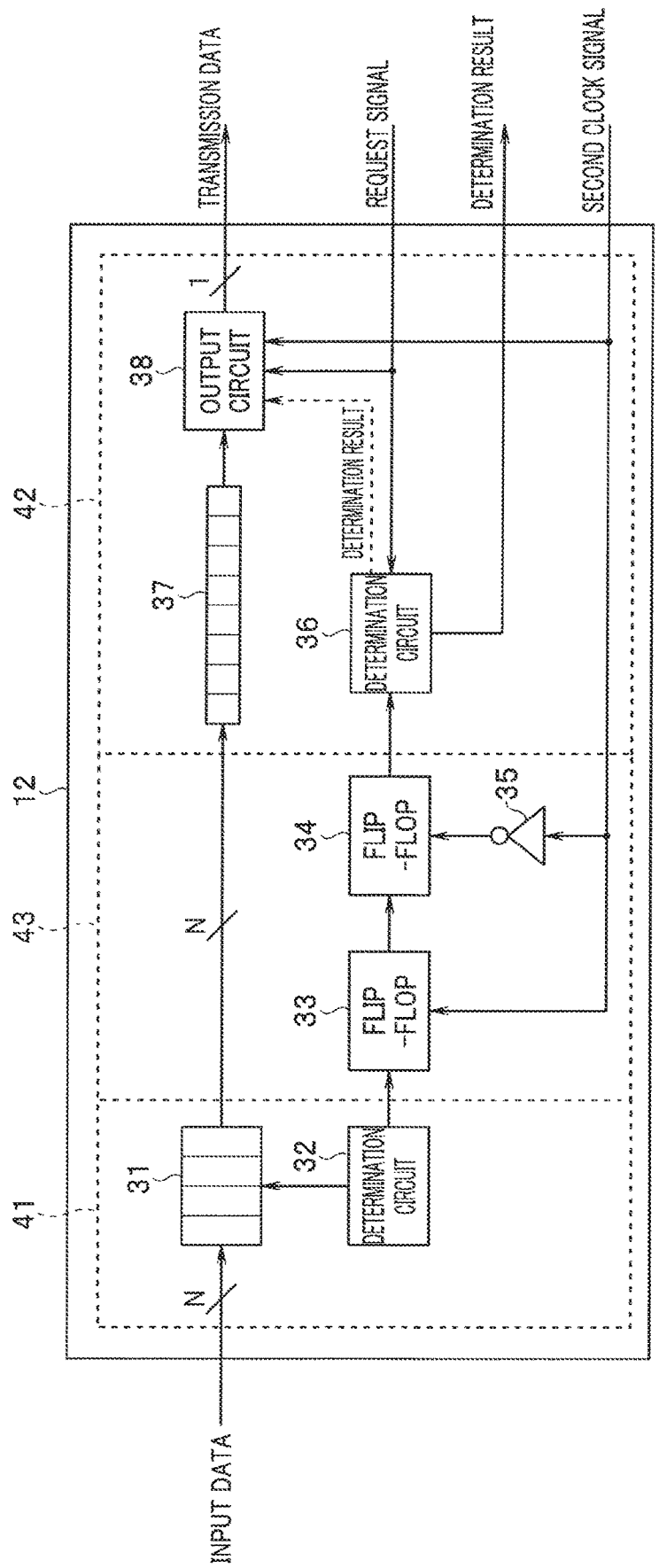
FIG. 2 is a block diagram illustrating a configuration of a serial communication circuit of a first MCU.

FIG. 2 is a block diagram illustrating a configuration of the serial communication circuit of the first MCU.

The serial communication circuit 12 includes a FIFO 31, a first determination circuit 32, a first flip-flop 33, a second flip-flop 34, an inverter 35, a second determination circuit 36, a shift register 37, and an output circuit 38.

The FIFO 31 and the first determination circuit 32 constitute a first clock domain section 41 which operates with the first clock signal (internal clock) generated at the clock generation circuit 11.

The second determination circuit 36, the shift register 37, and the output circuit 38 constitute a second clock domain section 42 which operates with the second clock signal (external clock) input from the serial communication circuit 22 of the second MCU 20.

Further, the first flip-flop 33, the second flip-flop 34, and the inverter 35 constitute an asynchronous communication section 43. The asynchronous communication section 43 performs clock transfer processing of transferring output (determination result) of the first determination circuit 32 from the first clock signal (internal clock) to the second clock signal (external clock).

To the FIFO 31, input data of a predetermined bit width, for example, an N-bit width, which is synchronized with the second clock signal, is input. The FIFO 31, which is a first-in first-out buffer, holds up to M stages of input data of an N-bit width, and outputs the data of an N-bit width to the shift register 37 using a first-in first-out scheme.

The shift register 37 is a register which holds data of an N-bit length in one-bit width. The shift register 37 receives data of an N-bit width from the FIFO 31 as input, and outputs data to the output circuit 38 one bit at a time in accordance with the second clock signal which is asynchronous with the first clock signal.

To the output circuit 38, the second clock signal and the request signal are input. The output circuit 38 outputs data output from the shift register 37 one bit at a time in synchronization with the second clock as transmission data, in response to the request signal.

The first determination circuit 32 determines whether or not an underflow occurs by detecting whether or not data is held in the FIFO 31, that is, whether or not the FIFO 31 is empty. The first determination circuit 32 determines that an underflow does not occur in a case where data is held in the FIFO 31, and determines that an underflow occurs in a case where data is not held in the FIFO 31.

In the present specification, the underflow is a state where a data amount held in the FIFO 31 or the shift register 37 is less than a data amount required as transmission data. In other words, the underflow is a state where the data amount held in the FIFO 31 or the shift register 37 is less than n bits. Further, the underflow error indicates an error such as transmission of empty data or incomplete data due to the underflow.

Note that the first determination circuit 32 may determine whether or not an underflow occurs based on whether or not the data amount held in the FIFO 31 is equal to or less than a predetermined value. The first determination circuit 32 outputs a determination result of the underflow to the first flip-flop 33.

The second clock signal is input to the first flip-flop 33, and the second clock signal inverted by the inverter 35 is input to the second flip-flop 34. Therefore, the first flip-flop 33 operates at a rising edge of the second clock signal. On the other hand, the second flip-flop 34 operates at a falling edge of the second clock signal.

As a result, the determination result of the underflow of the first determination circuit 32 is taken in the first flip-flop 33 at the rising edge of the second clock signal, and output to the second flip-flop 34. Then, the determination result of the underflow output from the first flip-flop 33 is taken in the second flip-flop 34 at the falling edge of the second clock signal, and output to the second determination circuit 36.

The second determination circuit 36 outputs a determination result of an underflow error in accordance with the request signal and output of the second flip-flop 34. The second determination circuit 36 determines that an underflow error occurs, for example, if the output of the second flip-flop 34 indicates occurrence of an underflow upon input of the request signal. In a case where an underflow error occurs, the second determination circuit 36 outputs a determination result of the underflow error to the serial communication circuit 22 of the second MCU 20 as an interrupt signal. The second clock signal may be input to the second determination circuit 36.

Note that, as indicated with a dashed arrow in FIG. 2, it is also possible to employ a configuration where the determination result of the underflow error of the second determination circuit 36 is input to the output circuit 38. If the determination result of the underflow error is input from the second determination circuit 36, the output circuit 38 outputs output data after adding the determination result to an end of the output data.

Figure 3:
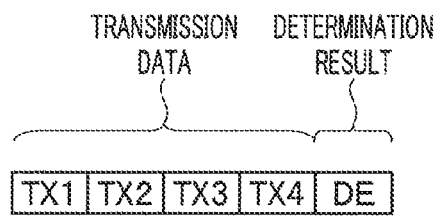
FIG. 3 is a view illustrating an example of transmission data when a determination result of an underflow error is added to the transmission data.

FIG. 3 is a view illustrating an example of transmission data when the determination result of the underflow error is added to the transmission data. As illustrated in FIG. 3, if the determination result of the underflow error is input from the second determination circuit 36, the output circuit 38 outputs transmission data after adding the determination result DE to an end of the last transmission data TX4 among four pieces of transmission data TX1 to TX4. Note that while the transmission data TX1 to TX4 is respectively data of one bit, the transmission data is not limited to this, and may be respectively data of two or more bits.

Figure 4:
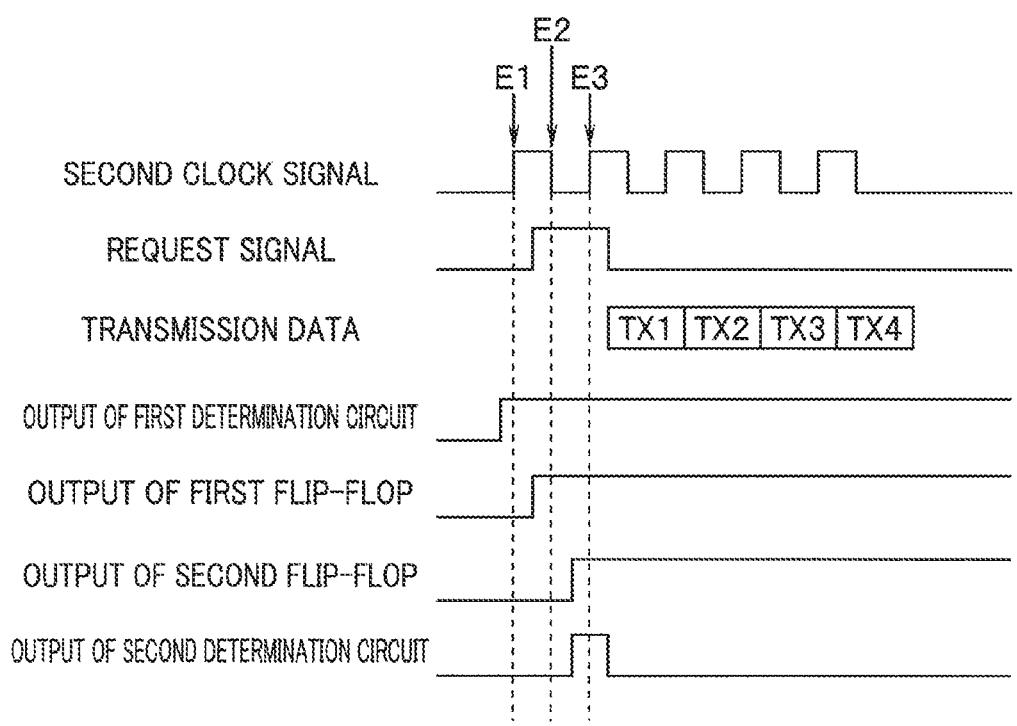
FIG. 4 is a timing chart for explaining an operation upon determination of an underflow error.

An operation upon determination of an underflow error will be described next. FIG. 4 is a timing chart for explaining an operation upon determination of an underflow error. Note that an example in FIG. 4 indicates a case where data is input to the FIFO 31 immediately before an underflow error occurs, and the underflow is resolved. In a case where the first determination circuit 312 determines that data is not held in the FIFO 31, and an underflow occurs, the first determination circuit 32 outputs a signal of an L level. In a case where the first determination circuit 32 determines that data is held in the FIFO 31, and an underflow does not occur, the first determination circuit 32 outputs a signal of an H level. In other words, output of the first determination circuit 32 transitions from the L level to the H level immediately before a rising edge E1 of the second clock signal.

To the serial communication circuit 12 of the first MCU 10, the second clock signal and the request signal are input from the serial communication circuit 22 of the second MCU 20. The serial communication circuit 22 generates the second clock signal so as to oscillate only during output of the request signal and the transmission data, and transmits the second clock signal to the serial communication circuit 12. In the example in FIG. 4, five clocks are input as the second clock signal to input the request signal and output four pieces of transmission data TX1 to TX4.

The first determination circuit 32 determines whether or not there is data in the FIFO 31, and outputs a determination result of an underflow to the first flip-flop 33. More specifically, in a case where the first determination circuit 32 determines that data is not held in the FIFO 31, and an underflow occurs, the first determination circuit 32 outputs a signal of an L level to the first flip-flop 33 as the determination result of the underflow. On the other hand, in a case where the first determination circuit 32 determines that data is held in the FIFO 31, and an underflow does not occur, the first determination circuit 32 outputs a signal of an H level to the first flip-flop 33 as the determination result of the underflow.

To the first flip-flop 33, the second clock signal is input. The determination result of the underflow output from the first determination circuit 32 is taken in the first flip-flop 33 at the rising edge E1 of the second clock signal, and output to the second flip-flop 34. More specifically, in a case where data is not held in the FIFO 31, and an underflow occurs, a signal of an L level is output to the second flip-flop 34. In a case where data is held in the FIFO 31, and an underflow does not occur, a signal of an H level is output to the second flip-flop 34.

Further, the second clock signal is inverted by the inverter 35, and input to the second flip-flop 34. Therefore, the second flip-flop 34 takes in output of the first flip-flop 33 at a falling edge E2 of the second clock signal and outputs the output to the second determination circuit 36. More specifically, in a case where data is not held in the FIFO 31, and an underflow occurs, a signal of an L level is output to the second determination circuit 36. In a case where data is held in the FIFO 31, and an underflow does not occur, a signal of an H level is output to the second determination circuit 36.

Note that while, in the present embodiment, the first flip-flop 33 operates at the rising edge of the second clock signal, and the second flip-flop 34 operates at the falling edge of the second clock signal, the operation is not limited to this, and the first flip-flop 33 may operate at the falling edge of the second clock signal, and the second flip-flop 34 may operate at the rising edge of the second clock signal.

The second determination circuit 36 outputs a determination result of an underflow error based on the request signal and output of the second flip-flop 34. In other words, the second determination circuit 36 can obtain a determination result of an underflow error at a time point of an initial rising edge E3 of the second clock signal after the request signal is input. More specifically, the second determination circuit 36 determines that an underflow error does not occur in a case where the request signal is an H level and output of the second flip-flop 34 is a signal of an H level at a time point of the rising edge E3, and outputs a signal of an H level as the determination result of the underflow error. When the signal of the H level is output from the second flip-flop 34, the transmission data TX1 to TX4 is transmitted through a normal operation.

When an underflow error occurs, the second determination circuit 36 outputs a signal of an L level in a case where the request signal is an H level and the output of the second flip-flop 34 is a signal of an L level at a time point of the rising edge E3. As a result, it is possible to output the determination result of the underflow error to the serial communication circuit 22 of the second MCU 20 as an interrupt signal before the output circuit 38 transmits the transmission data TX1 to TX4. Further, because the second determination circuit 36 outputs the determination result of the underflow error as an interrupt signal, it is not necessary to delay transmission timings of the transmission data TX1 to TX4.

Further, in a case where the second determination circuit 36 outputs the determination result of the underflow error to the output circuit 38, the output circuit 38 can obtain the determination result of the underflow error at a time point of the rising edge E3 of the second clock signal. As a result, the output circuit 38 can transmit the transmission data to the serial communication circuit 22 of the second MCU 20 after adding the determination result of the underflow error to an end of the transmission data.

In a case where the second MCU 20 recognizes that an underflow error occurs from the determination result of the underflow error, the second MCI 20 can request transmission of data again by discarding the transmission data and transmitting the request signal and the second clock signal to the first MCU 10.

Figure 5:
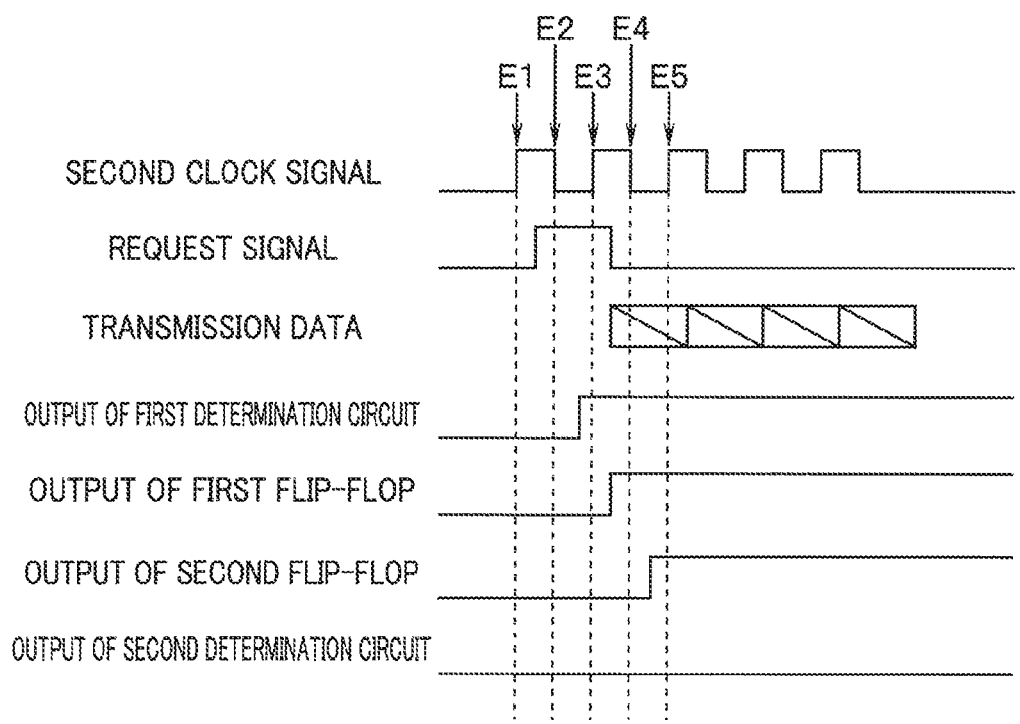
FIG. 5 is a timing chart for explaining an operation upon determination of an underflow error.

Description will be provided concerning a fact that the second MCU 20 can accurately detect occurrence of an underflow error even in a case where data is added to the FIFO 31 immediately after transmission of data is started. FIG. 5 is a timing chart for explaining an operation upon determination of an underflow error. Note that an example in FIG. 5 indicates a case where additional data is input to the FIFO 31 immediately after the shift register 37 starts output of data in a state where an underflow occurs. In other words, the output of the first determination circuit 32 transitions from an L level to an H level immediately before the rising edge E3 of the second clock signal.

In a case where an underflow error is detected without using the present embodiment, for example, the first determination circuit can output a determination result of an underflow upon receipt of the request signal (rising of the request signal) as the determination result of the underflow error. Because detection of an underflow is executed based on the first clock signal, it is necessary to perform clock transfer processing so that the request signal is synchronized with the first clock signal, that is, it is necessary to cause the request signal to pass through two flip-flops. Until the request signal passes through two flip-flops and is input to the first determination circuit, that is, until a second rising edge (E5) of the second clock signal since the request signal has been input, the shift register holds incomplete data less than n bits, and the output of the first determination circuit 32 transitions from an L level to an H level. In other words, when the request signal is input to the first determination circuit, an underflow error is not detected although an underflow error occurs.

On the other hand, the first determination circuit 32 of the present embodiment switches a determination result of an underflow error at a timing based on the first clock signal. The first flip-flop 33 takes in a determination result of an underflow at a timing (rising edge E1) before the shift register 37 takes in data from the FIFO 31. The determination result of the underflow is output to the second flip-flop 34 at a timing based on a falling edge E2. The second determination circuit 36 performs determination of an underflow error based on the determination result of the underflow at a timing of the initial rising edge E1. Therefore, even in a case where data is added to the FIFO 31 immediately after the shift register 37 starts output of data, it is possible to accurately detect occurrence of an underflow error based on data held in the FIFO 31 immediately before the shift register 37 starts output.

Note that while description has been provided assuming that the second determination circuit 36 outputs an OR of output of the second flip-flop 34 and the request signal, the embodiment is not limited to this. For example, the second determination circuit 36 may be a circuit which outputs an OR of a signal obtained by inverting the output of the second flip-flop 34 and the request signal. In other words, the second determination circuit 36 may be a circuit which outputs a signal of an H level in a case where an underflow occurs, and outputs a signal of an L level in a case where an underflow does not occur. Further, for example, the second determination circuit 36 may be a circuit to which the second clock signal is input and which holds and outputs an OR of the output of the second flip-flop 34 at a time point of the rising edge E3 and the request signal.

The request signal of the present embodiment is not limited to the configuration of FIG. 4. The request signal does not have to exist independently, as long as a function of notifying the start of communication (request) can be achieved. For example, the chip select signal can be used as the request signal. The start of communication can be detected by detecting the transition of assertion from desertion of the chip select signal (CS #) that is continuously asserted during communication.

As described above, the serial communication circuit 12 which constitutes the data transmission device takes in a determination result of an underflow at the rising edge E1 of the second clock signal at the first flip-flop 33, and takes in a determination result of an underflow at the falling edge E2 of the second clock signal at the second flip-flop 34. Then, the second determination circuit 36 can obtain a determination result of an underflow error based on the request signal and the output of the second flip-flop 34 and can determine whether or not an underflow error occurs before transmission data is transmitted from the output circuit 38. As a result, according to the data transmission device of the present embodiment, it is possible to accurately detect an underflow error.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A data transmission device, comprising:
   a buffer that is synchronized with a first clock signal and that holds input data of a predetermined bit width;
   a first determination circuit configured to determine whether or not the input data is held in the buffer;
   a first flip-flop configured to receive output of the first determination circuit as input and operate at one of a rising edge and a falling edge of a second clock signal which is asynchronous with the first clock signal;
   a second flip-flop configured to receive output of the first flip-flop as input and operate at another of the rising edge and the falling edge of the second clock signal; and
   a second determination circuit configured to determine an error based on a request signal which is synchronized with the second clock signal and output of the second flip-flop.

2. The data transmission device according to claim 1, further comprising:
   a shift register that holds the input data of the predetermined bit width output from the buffer, and is configured to output the input data in accordance with the second clock signal; and
   an output circuit configured to output the input data output from the shift register as transmission data in synchronization with the second clock signal, in response to the request signal.

3. The data transmission device according to claim 2, wherein the output circuit outputs the transmission data after adding a determination result of the error to an end of the transmission data.

4. The data transmission device according to claim 2, wherein the second clock signal oscillates only while the request signal is input to the output circuit and while the output circuit outputs the transmission data.

5. The data transmission device according to claim 1, wherein the first determination circuit determines whether or not the input data is held in the buffer based on whether or not a data amount held in the buffer is equal to or greater than a predetermined bit width.

6. The data transmission device according to claim 1, wherein the buffer is a first-in first-out buffer, and
   the first determination circuit determines whether or not, among the input data, untransmitted input data is held in the buffer.

7. The data transmission device according to claim 1, wherein the error is an underflow error.

8. A data transmission device, comprising:
   a buffer that is synchronized with a first clock signal and that holds input data;
   a first determination circuit configured to determine whether or not the input data of a predetermined width is held in the buffer;
   a first flip-flop configured to receive output of the first determination circuit as input and operate at one of a rising edge and a falling edge of a second clock signal which is asynchronous with the first clock signal;
   a second flip-flop configured to receive output of the first flip-flop as input and operate at another of the rising edge and the falling edge of the second clock signal; and
   a second determination circuit configured to output a signal based on output of the second flip-flop upon input of a request signal which is synchronized with the second clock signal.

* * * * *